United States Patent [19]

Venutolo

[11] Patent Number: 4,954,453
[45] Date of Patent: Sep. 4, 1990

[54] METHOD OF PRODUCING AN ARTICLE COMPRISING A MULTICHIP ASSEMBLY

[75] Inventor: John H. Venutolo, Summit, N.J.

[73] Assignee: AT&T Bell Laboratories, Murray Hill, N.J.

[21] Appl. No.: 316,050

[22] Filed: Feb. 24, 1989

[51] Int. Cl.$^5$ .................. H05K 3/00; H01L 21/66
[52] U.S. Cl. ........................ 437/8; 437/209; 29/762; 29/742; 29/847
[58] Field of Search .............. 437/209, 8; 29/847, 29/762, 742

[56] References Cited

U.S. PATENT DOCUMENTS

| H 629 | 4/1989 | Murdoch | 357/28 |
|---|---|---|---|
| 4,012,832 | 3/1977 | Crane | 437/008 |
| 4,418,466 | 12/1983 | Piedmont et al. | 437/008 |
| 4,437,229 | 3/1984 | Bitler et al. | 437/008 |
| 4,617,729 | 10/1986 | Celnik | 437/008 |
| 4,628,590 | 12/1986 | Udo et al. | 437/008 |
| 4,640,002 | 2/1987 | Phillips et al. | 437/008 |
| 4,675,717 | 6/1987 | Herrero | |
| 4,806,503 | 2/1989 | Yoshida et al. | 437/008 |

FOREIGN PATENT DOCUMENTS

0117969 10/1978 Japan .
0105646 8/1981 Japan .

OTHER PUBLICATIONS

*Journal of Electronic Materials*, vol. 18, No. 1, 1984, "Flip-Chip Replacement Within The Constraints Imposed By Multilayer Ceramic (MLC) Modules", by K. T. Puttlitz, pp. 29-46.

*Solid State Technology*, 1986, "Advanced Packaging for VLSI", by C. J. Bartlett et al, pp. 119-123.

*Proceedings of the Electronic Components Conference*, Boston, May 1987, C. J. Bartlett et al.

*Primary Examiner*—Brian E. Hearn
*Assistant Examiner*—Andrew Griffis
*Attorney, Agent, or Firm*—Eugene E. Pacher

[57] ABSTRACT

In methods of producing an article that comprises a multichip assembly, in which the (typically electronic but not excluding opto-electronic) chips are bonded to a substrate by means of spaced-apart localized solder regions (frequently referred to as "solder bumps"), it is frequently desirable to be able to remove a given chip from the substrate and to replace it with another chip. According to the invention, such chip removal is accomplished by a technique that comprises heating the solder bumps between the given chip and the substrate to a temperature below the solidus temperature of the solder in a manner such that a temperature gradient exists across the solder bumps, and applying to the given chip simultaneously a torque and a lifting force sufficient to cause separation of the given chip from the substrate. The technique can be carried out such that the solder bumps remaining on the substrate after chip removal are of substantially uniform height, facilitating attachment of the replacement chip.

5 Claims, 2 Drawing Sheets

METHOD OF PRODUCING AN ARTICLE COMPRISING A MULTICHIP ASSEMBLY

FIELD OF THE INVENTION

This application pertains to methods of manufacturing of articles that comprise a substrate with a multiplicity of semiconductor chips thereon.

BACKGROUND OF THE INVENTION

It is known that multichip assemblies can be produced by flip-chip bonding of IC chips to an appropriate substrate. See, for instance, K. T. Puttlitz, *Journal of Electronic Materials*, Vol. 13(1), pages 29-46. Among substrates that can usefully be employed are silicon wafers with a multiplicity of conductor and insulator layers thereon, such as described, for instance, in U.S. Pat. No. 4,675,717, incorporated herein by reference.

In general, producing a multichip assembly of the type that is relevant to this application comprises providing a substrate with an appropriate pattern of solder bumps thereon, placing the chips face-down onto the substrate such that solder bumps on the chips rest atop of the corresponding solder bumps on the substrate, causing a preliminary bond to form between contacting solder bumps (this is frequently referred to as "tacking"), and forming a final bond by reflow of the solder.

In the thus produced assembly the chips are raised above the substrate surface. Exemplarily this "stand-off height" is about 50 $\mu$m. The re-flowed solder bumps provide the electrical connections between chips and substrate, as well as serving to mechanically secure the chips to the substrate.

It will be understood by those skilled in the art that a method of producing a multichip assembly of the type discussed comprises one or more testing steps. For instance, the assembly might be tested after the tacking operation, and/or after the reflow operation. If these tests indicate that the assembly meets prescribed specifications then the assembly can be combined in known manner with other components, assemblies, or subsystems into an article of commerce. On the other hand, the assembly itself could form an article of commerce.

If the above referred to testing of the assembly indicates that one or more of the chips are not functioning as intended then one can, at least in principle, simply discard the assembly. However, as the number of chips per assembly increases the need for a repair capability increases. In particular, it becomes economically important to be able to replace one or more defective chips on an assembly without at the same time impairing the quality (including the reliability) of the assembly. The above referred to paper by K. J. Puttlitz describes a replacement technique.

Known replacement techniques generally comprise a "dressing" operation during which the height of solder bumps remaining on the substrate after chip removal is adjusted such that all the solder bumps are again of substantially the same height. This is typically accomplished by wicking away some of the solder. The need for dressing of the substrate arises because prior art methods of removing chips typically do not result in the retention of solder bumps of uniform height on the substrate.

It would clearly be desirable to have available a method of chip removal that typically results in the retention on the substrate of solder bumps that are all of substantially the same height, since this may make it possible to dispense with the dressing operation. This application discloses a method of producing an article that comprises such a chip removal method.

THE INVENTION

The inventive method of producing an article that comprises a multichip assembly comprises a novel technique for removing a given chip from the substrate. The technique has features that can result in substantially uniform height of the retained solder bumps on the substrate. In preferred embodiments of the invention the height of the retained solder bumps varies so little that a dressing operation prior to attachment of a replacement chip typically is not necessary.

The inventive method comprises providing a substrate, providing a multiplicity of (typically electronic, but possibly comprising opto-electronic) subassemblies (generally referred to as "chips"), and attaching the chips to the substrate by means of spaced apart localized solder connections. It will be appreciated that the method typically is used to produce a multiplicity of multichip assemblies, and that the method comprises testing some or all of the assemblies. If the testing reveals that a subassembly does not meet predetermined criteria due to a fault associated with a given chip then, according to the invention, the chip is to be removed from the substrate by means of the novel technique. The technique comprises heating at least the solder connections between the given chip and the substrate to a temperature Tr that is below the solidus temperature of the solder, contacting the given chip with an appropriate removal tool, and applying, by means of the removal tool, to the given chip a combination of a torque and of a lifting force, the combination being sufficient to cause separation of the given chip from the substrate. In preferred embodiments the separation occurs without "smearing" of the solder bumps that remain on the substrate, and without damage to the metallization on the substrate.

Figure 1:
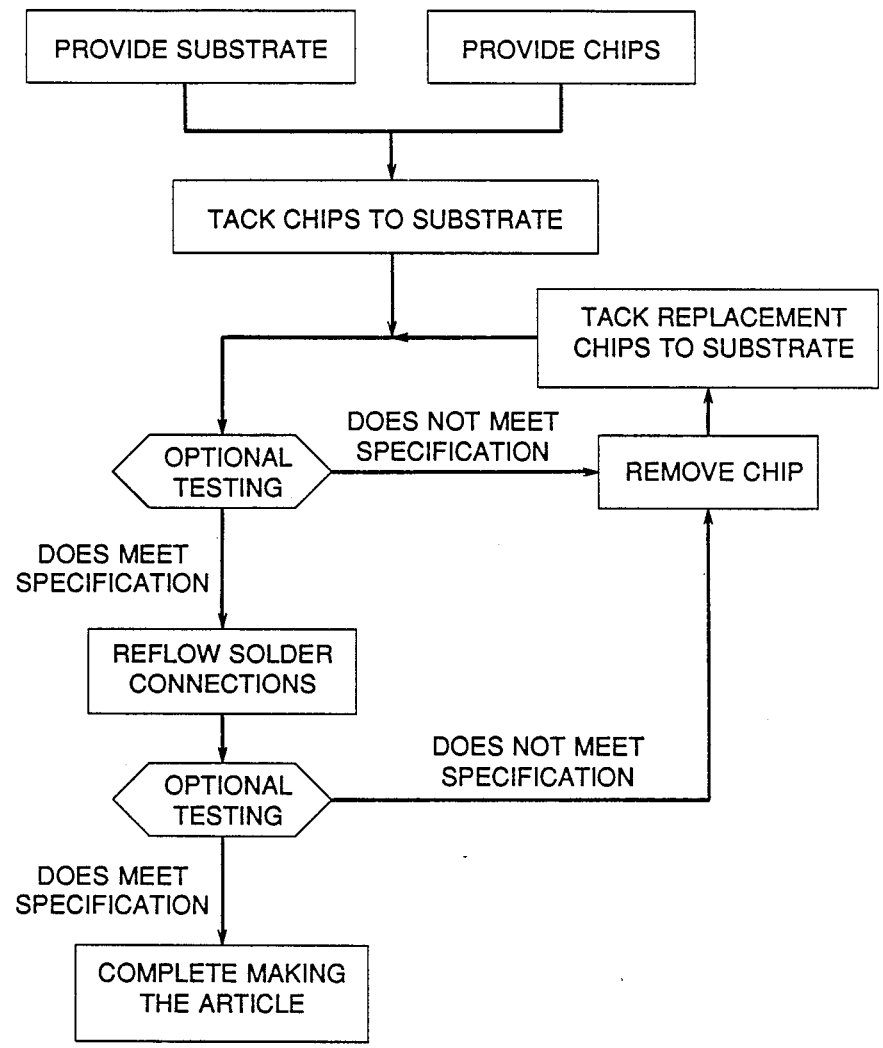
FIG. 1 is a flow chart description of major process steps in an exemplary embodiment of the inventive process.

FIG. 1 shows a flow chart in which some major steps of an exemplary process according to the invention are indicated. In particular, the flow chart indicates that, after tacking the chips to the substrate and/or after solder reflow, at least some of the multichip assemblies are tested. If indicated by the test results, one or more chips are then removed from a given assembly, a replacement chip (or chips) is tacked into place, and the given assembly is then subjected to a reflow operation. The thus repaired assembly may then be re-tested. In a currently preferred embodiment all assemblies are tested after tacking.

Figure 2:
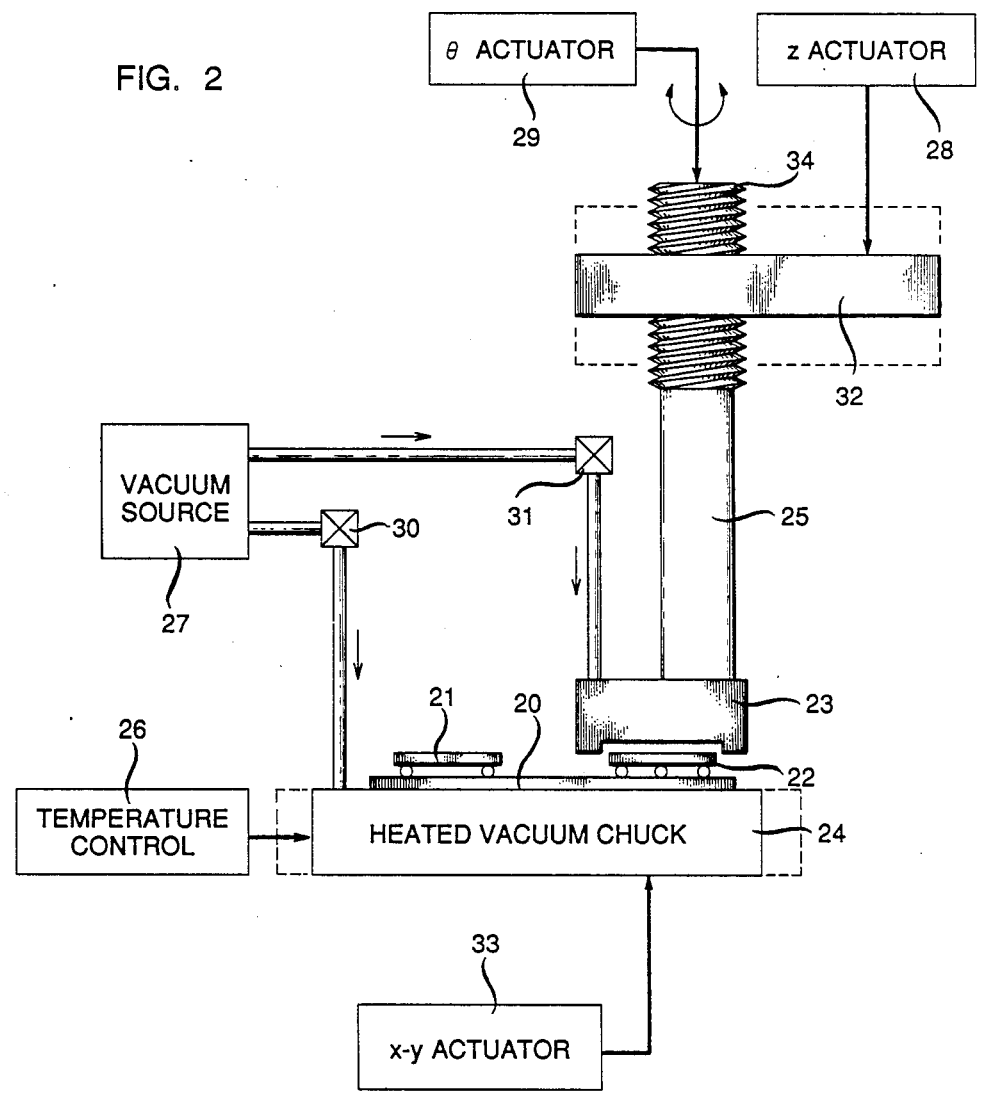
FIG. 2 schematically depicts exemplary apparatus for removing a chip from a substrate.

FIG. 2 schematically depicts exemplary apparatus for removing a chip from a substrate 20. The means comprise vacuum chuck 24 and vacuum-activated removal tool (gripper) 23. The vacuum chuck can be heated by conventional means, with the temperature controlled by means of controller 26. The chuck is operated in conventional fashion by means that comprise vacuum source 27 and valve 30. Substrate 20, with a multiplicity of chips thereon (of which only two, designated 21 and 22, are shown), is held in place by the vacuum chuck. The gripper, which is connected by shaft 25 to holding means 32, is also connected to vacuum source 27, with valve 31 provided to regulate the application of the vacuum. The vacuum chuck can be moved in the x-y plane by means that comprise actuator 33, and the holding means can be moved in the z-direction by means that comprise actuator 28. The means for placing the gripper in position over the chip that is to be removed can be conventional and are indicated only schematically.

Significantly, the means for removing a chip comprise means for simultaneously applying a torque and a lifting force to the chip, and FIG. 2 schematically shows an exemplary embodiment of such means. Shaft 25 comprises thread means 34, with the holding means 32 comprising mating thread means. By means of actuator 29 the gripper is caused to undergo a (typically small, e.g., $\lesssim 20°$) angular displacement which results in simultaneous lifting of the gripper. The relationship between lift and rotation is not critical, provided that the combined motion results predominantly in a shear deformation of the solder connections. Exemplarily, an arrangement that results in a lifting motion of about 20 $\mu$m/degree rotation has been found to work well. We except that values in the range 5–50 $\mu$m/degree will be satisfactory, with values outside this range not necessarily being unacceptable. However, for values below about 5 $\mu$m/degree the possibility of smearing exists, whereas for values above about 50 $\mu$m/degree the deformation is primarily an extension, resulting in possible damage to the substrate.

It will be appreciated that placement of the gripper over the chip can be done manually or automatically, by means of a robotic system, depending on the requirements of the manufacturing process. Those skilled in the art will be able to implement either embodiment, or combinations thereof. Similarly, the twist-and-lift motion can be imparted to the gripper manually or automatically. The choice regarding the appropriate degree of automation will typically be made on economic grounds.

Significantly, the heating of the assembly during chip removal is carried out such that a temperature gradient exists across the solder connections. By this is meant that the substrate/solder interfaces are at a different temperature than the solder/chip interfaces. The temperature difference may be small (possibly less than 1° C.), provided it suffices to bias the process of solder connection-separation such that the separations reliably occur at or close to a predetermined height above the substrate. Exemplarily, if the stand-off height between the given chip and the substrate is about 50 $\mu$m then the height of the retained solder bump on the substrate can vary by as little as 5 $\mu$m from the predetermined height. In a currently preferred embodiment of the invention the heating is carried out such that the substrate/solder interfaces are hotter than the solder/chip interfaces. This bias results in separation of the solder connections close to the solder/chip interface, with substantially all of the solder retained on the substrate, such that a replacement chip can be attached to the substrate without dressing of the substrate.

Typically the substrate is heated more or less uniformly, although localized heating of the substrate region underlying the chip that is to be removed may be advantageous in some circumstances. If it is desired that the chip/solder interface is hotter than the solder/substrate interface then the chip will be heated, e.g., by means of a heated gripper.

The inventive method of producing a multichip assembly comprises, in addition to the novel chip removal step, a variety of steps which can be conventional. Furthermore, the substrate and the chips can be conventional. Exemplarily, the substrate can be a multi-layer Si-based substrate such as is disclosed in U.S. Pat. No. 4,675,717, or a multilayer ceramic substrate as discussed in the above cited article by K. J. Puttlitz, both incorporated herein by reference. See, for instance, also C. J. Bartlett et al., *Solid State Technology*, Jun. 1986, pp. 119–123, and C. J. Bartlett et al., *Proceedings of the Electronic Components Conference*, Boston, May 1987.

In general, the novel chip removal technique can be practiced with multichip assemblies that comprise chips that are attached to the substrate by a solder bump technique. In such assemblies not only is a given chip mechanically secured to the substrate by means of a multiplicity of spaced apart, localized solder connections but electrical communication between the chip and the substrate is via the same solder connections.

As is known to those skilled in the art, attaching a chip to a substrate by a solder bump technique comprises placing the chip onto the substrate such that the solder bumps on the chip come to rest on corresponding solder bumps on the substrate, and, typically, establishing a preliminary bond between the corresponding solder bumps. This is usually referred to as "tacking", and is exemplarily carried out by heating the substrate and chip to a temperature below the solidus temperature of the solder, and applying a force that urges the chip towards the substrate. Appropriate tacking temperatures frequently are in the range 85–95% of the (absolute) solidus temperature $T_m$ of the solder. For instance, in a 95/5 Pb/Sn solder ($T_m = 305°$ C. $= 578$K), the tacking temperature is advantageously in the range 245°–265° C. For temperatures below about 85% (possibly even below about 90%) of $T_m$ the force required to achieve tacking may become too large, and for temperatures above about 95% of $T_m$ excessive deformation of the solder bumps could result.

The attachment process also comprises a reflow operation during which the solder bumps are heated above the liquidus temperature such that the solder bumps fuse, resulting in a unitary solder connection.

The previously referred to testing can be done after tacking but before reflow and/or after reflow. In either case, if the results of the testing indicate that one or more chips should be replaced, the chip removal technique according to the invention is employed to facilitate chip replacement.

It has been found that the temperature of the solder connections advantageously is in, or close to, the tacking temperature range during chip removal. For instance, for the above referred to 95/5 solder, temperatures in the range 240°–260° C. were found to work well. For temperatures substantially below or above the limits of the tacking range separation height may vary excessively.

Example: An AVP-type assembly comprised a Si substrate with 24 VLSI chips flip-chip tacked thereto by means of solder bumps, and was produced by known techniques. The nominal stand-off height was 50 $\mu$m. The solder bumps were 95/5 Pb/Sn solder. Standard electrical testing of the assembly indicated that one of the chips needed to be replaced. The assembly was placed on a heatable vacuum chuck and the temperature of the chuck raised to about 255° C. The repair site as the substrate of the assembly was in good thermal contact with the chuck. The substrate temperature at the repair site therefore was similar to the temperature of the chuck. A gripping tool comprising a recessed portion that fit over the chip was mounted in a holder and placed over the chip that was to be removed, placement being achieved by means of manual x-y and z adjustments. The gripping tool was connected to a vacuum source. After placement of the tool was achieved the vacuum was activated such that the chip was held in the recessed portion of the tool. The tool comprised an inclined plane surface which caused a lifting motion of the gripping portion of the tool when that portion was rotated. The rate of lifting was about 38 μm/degree of rotation. Rotation of the tool through less than about 20° resulted in removal of the chip from the substrate, with all of the about 160 solder bumps separating close to the chip. The height of the solder bumps remaining on the substrate was substantially uniform and close to the original stand-off height. A replacement chip was tacked in place, and electrical testing indicated that the assembly met the specifications. The assembly was then subjected to a standard reflow operation and tested. It passed all the tests.

I claim:

1. Method of producing an article comprising a multichip assembly that comprises a substrate with a multiplicity of electronic subassemblies thereon, a given subassembly attached to the substrate by means of a multiplicity of localized solder regions, the subassemblies to be referred to as "chips" and the localized solder regions to be referred to as "solder bumps"; the method comprising
    (a) producing multichip assemblies;
    (b) testing at least some of the multichip assemblies;
    (c) if the testing indicates that a given assembly does not meet predetermined criteria due to a fault associated with a given chip or chips then the given chip or chips are removed from the substrate, and a replacement chip or chips are attached to the substrate; and the method further comprises
    (d) completing producing the article; CHARACTERIZED IN THAT step (c) comprises
    (e) heating at least the solder bumps between the given chip and the substrate to a temperature Tr, such that $T_r < T_m$, where $T_m$ is the absolute solidus temperature of the solder, the heating carried out such that a temperature gradient exists across the solder bumps; and
    (f) applying to the given chip a combination of a torque and a lifting force, the combination being sufficient to cause separation of the given chip from the substrate.

2. Method of claim 1, wherein $T_r$ is in the range 0.85–0.95 $T_m$.

3. Method of claim 2, wherein the solder comprises about 95% by weight Pb, the remainder comprising Sn, and wherein $T_r$ is in the range 240°–260° C.

4. Method of claim 1, wherein the torque and lifting force result in a lifting motion in the range 5–50 μm/degree rotation.

5. Method of claim 1, wherein the article is the multichip assembly.

* * * * *